(12) United States Patent
Yu et al.

(10) Patent No.: US 12,225,665 B2
(45) Date of Patent: Feb. 11, 2025

(54) CIRCUIT SYSTEM AND METHOD OF MANUFACTURING A PRINTED CIRCUIT BOARD

(71) Applicant: NVIDIA Corp., Santa Clara, CA (US)

(72) Inventors: MingYi Yu, Saratoga, CA (US); Greg Bodi, Santa Cruz, CA (US); Ananta Attaluri, San Jose, CA (US)

(73) Assignee: NVIDIA Corp., Santa Clara, CA (US)

( * ) Notice: Subject to any disclaimer, the term of this patent is extended or adjusted under 35 U.S.C. 154(b) by 233 days.

(21) Appl. No.: 17/737,297

(22) Filed: May 5, 2022

(65) Prior Publication Data

US 2023/0363093 A1 Nov. 9, 2023

(51) Int. Cl.
*H05K 1/18* (2006.01)
*H05K 1/02* (2006.01)
*H05K 3/30* (2006.01)
*H05K 7/20* (2006.01)

(52) U.S. Cl.
CPC .......... *H05K 1/181* (2013.01); *H05K 1/0213* (2013.01); *H05K 3/303* (2013.01); *H05K 7/209* (2013.01); *H05K 2201/10325* (2013.01)

(58) Field of Classification Search
CPC .... H05K 1/18; H05K 1/181–188; H05K 3/34; H05K 7/00; H05K 7/10; H05K 7/20; H05K 2201/10734; H01L 23/498; H01L 23/49816; H01L 23/49822; H01L 23/49833; H01L 23/522; H01L 23/5223; H01L 23/5227

USPC ........ 361/699–710, 760, 767–784, 790–795; 257/700–730, 660, 690; 174/250–264
See application file for complete search history.

(56) References Cited

U.S. PATENT DOCUMENTS

| | | | | |
|---|---|---|---|---|
| 6,490,161 | B1* | 12/2002 | Johnson | H01L 23/433 |
| | | | | 257/E23.09 |
| 7,924,568 | B2* | 4/2011 | Ho | H01L 23/4093 |
| | | | | 257/706 |
| 10,121,766 | B2* | 11/2018 | Monroe | H01L 23/5385 |
| 2003/0214800 | A1* | 11/2003 | Dibene, II | H01R 12/52 |
| | | | | 257/E23.09 |
| 2005/0093120 | A1* | 5/2005 | Millik | H05K 1/0262 |
| | | | | 257/E23.101 |
| 2007/0013080 | A1* | 1/2007 | DiBene | H01L 25/0652 |
| | | | | 257/E25.011 |
| 2016/0071818 | A1* | 3/2016 | Wang | H01L 24/49 |
| | | | | 257/773 |
| 2019/0098802 | A1* | 3/2019 | Mokler | H05K 9/0028 |
| 2019/0379325 | A1* | 12/2019 | Kondo | H10N 30/883 |
| 2020/0066830 | A1* | 2/2020 | Bharath | H01L 23/49822 |
| 2020/0373260 | A1* | 11/2020 | Hovis | H05K 1/141 |
| 2020/0396855 | A1* | 12/2020 | Ye | H05K 1/0218 |

\* cited by examiner

*Primary Examiner* — Tuan T Dinh
(74) *Attorney, Agent, or Firm* — Carnelian Law, LLC

(57) ABSTRACT

A circuit system and method of manufacturing a printed circuit board includes providing an integrated circuit package mounted on a first side of a printed circuit board and a power regulator connected to power terminals of the integrated circuit package through a cutout in the printed circuit board. The power regulator draws power from the printed circuit board by way of side pins around a periphery of the cutout.

20 Claims, 6 Drawing Sheets

CIRCUIT SYSTEM AND METHOD OF MANUFACTURING A PRINTED CIRCUIT BOARD

BACKGROUND

The transistor count and clock speeds of large-scale integrated circuits (ICs) continues to increase. As this occurs, there is a growing need to improve the power efficiency of such circuits to save the energy. As integrated process nodes become smaller, the power voltage for the circuits decreases, leading to increased effects of power supply noise. At the same time, power dissipation and power current may experience increases.

FIG. 1 depicts an example of a conventional manner of providing power to a large-scale integrated circuit package 102, such as a central processing unit or graphics processing unit. Power regulators 104 for the integrated circuit package 102 are distributed around the printed circuit board 106 on which the integrated circuit package 102 is surface mounted. The power regulators 104 tap into the power plane or planes of the printed circuit board 106. The power regulators 104 have traces leading to pins of the integrated circuit package 102 in the central power pin region 108.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
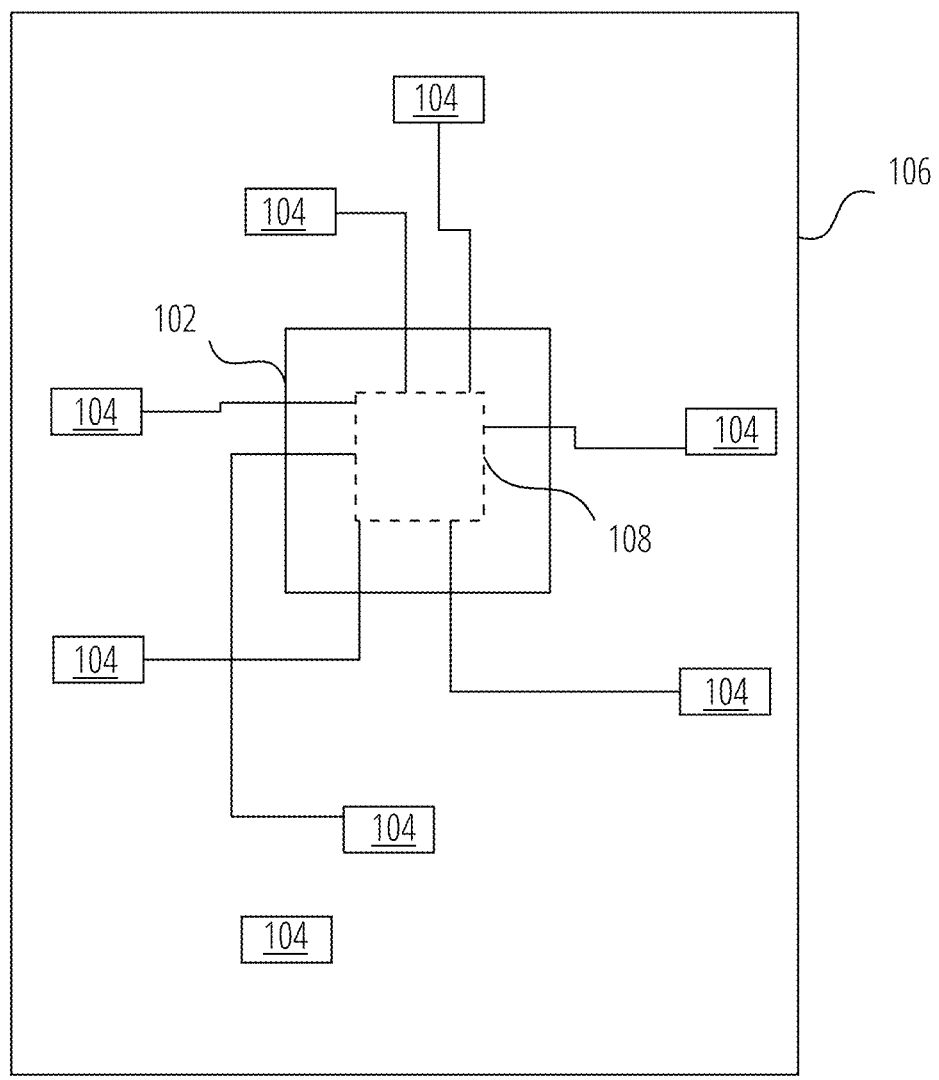
FIG. 1 depicts an example of a conventional manner of providing power to a large-scale integrated circuit package 102, such as a central processing unit or graphics processing unit.

Embodiments of a circuit system are described for more direct delivery of power to large scale integrated circuits. In some instances the circuit system may be efficiently manufactured by pressure fitting a power regulator to a printed circuit board (PCB), and directly soldering the integrated circuit package to the power output terminals of the power regulator. These configurations may result in a substantial reduction of power loss (e.g., over trace routes) when supplying power to the integrated circuit. In some embodiments, some terminals of the integrated circuit package may be soldered to the PCB while power supply terminals are pressure fit to the power regulator. For example in one embodiment spring pins may be utilized in a central power pin region of the integrated circuit package to interface with the power regulator. In various embodiments, the power regulator may receive power and control signals from the PCB via socket pins, solder connections on an opposite side of the PCB from the integrated circuit package, or side pins in a cutout region of the PCB.

The circuit systems may also advantageously lower the profile height of the power regulator on the PCB, and may simplify/improve thermal regulation by enabling heat transfer from the power regulator through the integrated circuit package to a heat sink. The circuit system may also advantageously enable a reduction in the number of power planes in the PCB, due to obviating routing requirements for power across the PCB from a distributed set of power regulators as done conventionally.

In one aspect, a circuit system includes an integrated circuit package mounted on a first side of a printed circuit board and a power regulator connected to (meaning, not routed over wire runs) power terminals of the integrated circuit package through a cutout in the printed circuit board. A power regulator is a circuit that conditions raw power drawn from a power plane of the printed circuit board—for example by filtering ripple, guarding against current and/or voltage spikes or fluctuations, and so on. The power regulator draws power from the printed circuit board by way of connections on a shelf region extending beyond an area of the cutout. A "shelf" in this sense means material extending beyond the cutout area, and can be readily seen in the exemplary depictions. Power terminals are any type of electrical connection, e.g., balls, pins, or pads.

The integrated circuit package may be mounted on "top" of the printed circuit board (meaning in the direction of thermal flow, which is usually "above" in the field due to heat rising). The power regulator may thus be mounted under the integrated circuit package. The integrated circuit package may be a graphics processing unit, a central processing unit, a high-capacity machine memory chip, or other integrated circuit.

The cutout may comprise an area smaller than a footprint of the integrated circuit package, where the footprint is the total area taken up by the integrated circuit package on the printed circuit board. The power terminals of the integrated circuit package (all, or most of them) may be located in a central region of the integrated circuit package, meaning a sub-region more or less in the center of the footprint of the integrated circuit package.

In one embodiment, the cutout is smaller than a footprint of the integrated circuit package and the power regulator, integrated circuit package, or both are centered on the cutout. A heat sink may be shared by the integrated circuit package and the power regulator for efficient thermal management.

In another aspect, a circuit system includes an integrated circuit package mounted on a first side of a printed circuit board, a power regulator connected to power terminals of the integrated circuit package through a cutout in the printed circuit board, and where the power regulator draws power from the printed circuit board by way of side pins mounted around the cutout. The side pins may be mounted in the cutout itself, i.e., along and around the interior edge of the cutout, or the side pins may be disposed in a hollow socket mounted and extending around the periphery of the cutout.

Other technical features may be readily apparent to one skilled in the art from the following figures, descriptions, and claims.

Figure 2:
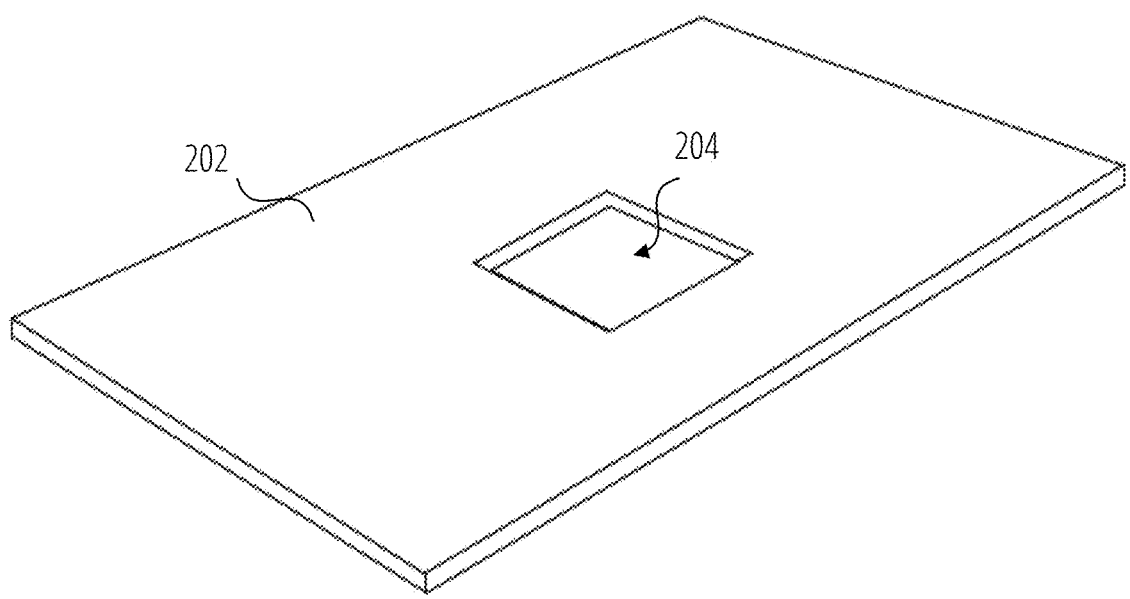
FIG. 2 depicts a printed circuit board 202 with a cutout 204 in one embodiment.

FIG. 2 depicts a printed circuit board 202 with a cutout 204 in one embodiment. The cutout 204 is located where an IC package will be placed on the printed circuit board 202, and is sized to comprise an inner power pin region of the IC package, but less than the entire footprint (area) of the IC package.

Figure 3:
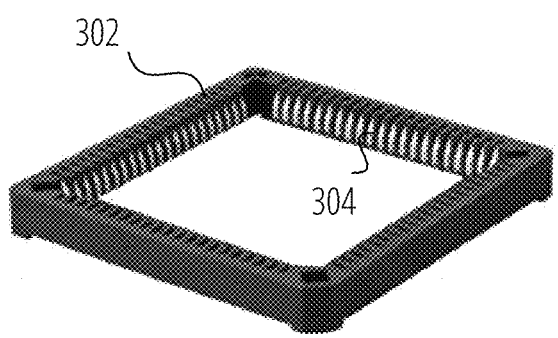
FIG. 3 depicts a chip package socket 302 in one embodiment.

FIG. 3 depicts a chip package socket 302 in one embodiment. The chip package socket 302 comprises rows of side pins 304 around its periphery. The side pins 304 couple to pins or pads on the bottom surface of the chip package socket 302, for interfacing (e.g., via soldering) with pads in a printed circuit board.

Figure 4A:
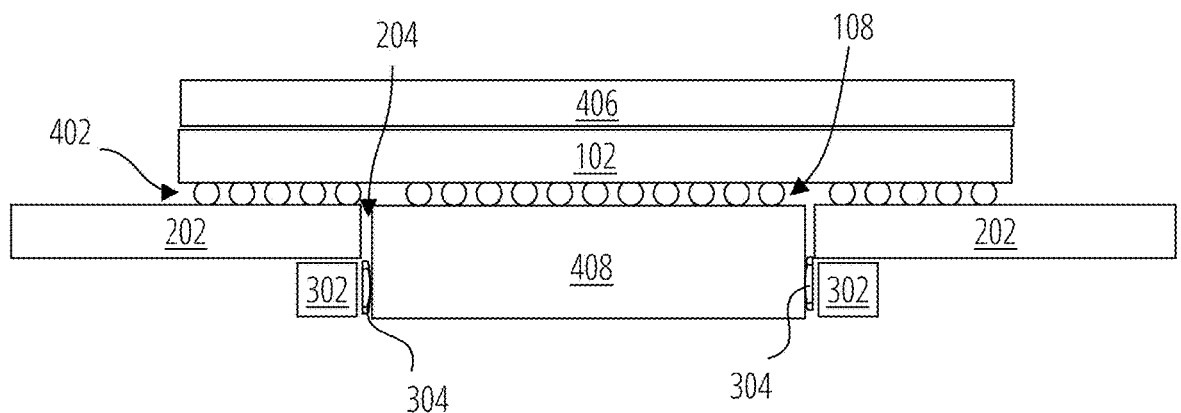
FIG. 4A through FIG. 4C depict a circuit system in different embodiments.
Figure 4B:
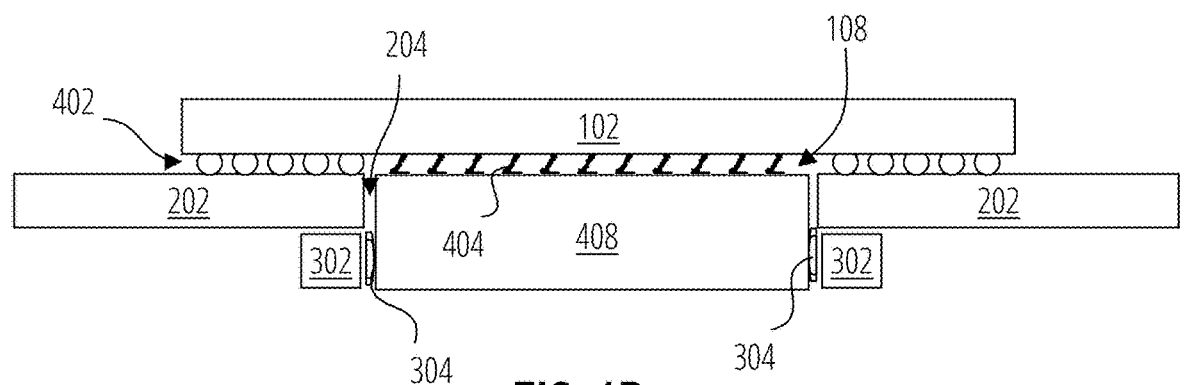
Figure 4C:
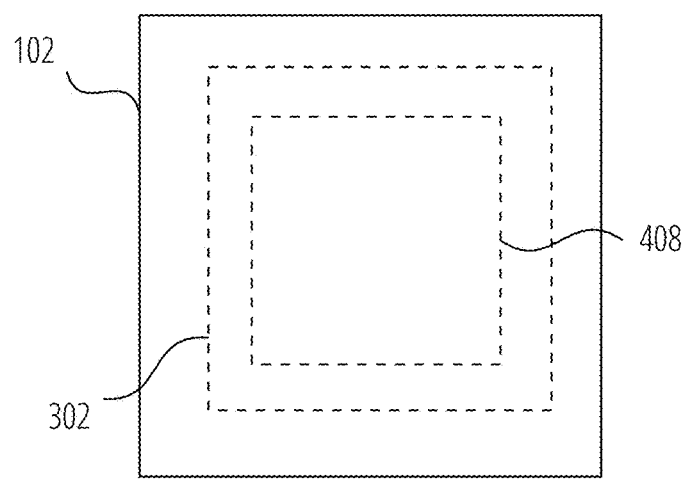

FIG. 4A through FIG. 4C depict a circuit system in different embodiments. The system comprises an integrated circuit package 102 interfaced via a ball grid array 402 to a printed circuit board 202. The integrated circuit package 102 is positioned such that a central power pin region 108 of the ball grid array 402 is aligned with and encompassed by the cutout 204 in the printed circuit board 202. For purposes of illustration and clarity of the depiction, the area of the central power pin region 108 may be exaggerated relative to the overall footprint of the integrated circuit package 102 in the drawings.

On an opposite side of the printed circuit board 202 from the integrated circuit package 102, a chip package socket 302 is mounted. A power regulator 408 is inserted into the chip package socket 302 such that power plane and control signals from the printed circuit board 202 are received into the power pin region 108 via the side pins 304 of the chip package socket 302. Other circuit packages may also be mounted on either side of the printed circuit board 202. The embodiment depicted in FIG. 4B is similar to that in FIG. 4A, except that spring pins 404 are utilized to interface the integrated circuit package 102 and the power pin region 108 of the power regulator 408.

The integrated circuit package 102 may be mounted on a top side of the printed circuit board 202, the power regulator 408 may be mounted under the integrated circuit package 102 via the cutout 204, and the power regulator 408 and the integrated circuit package 102 may share a common heat sink 406.

Figure 5A:
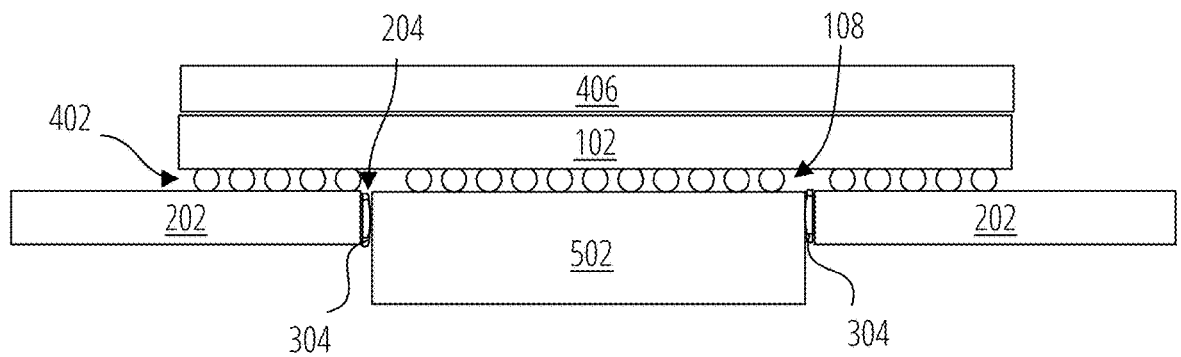
FIG. 5A through FIG. 5C also depict a circuit system in different embodiments.
Figure 5B:
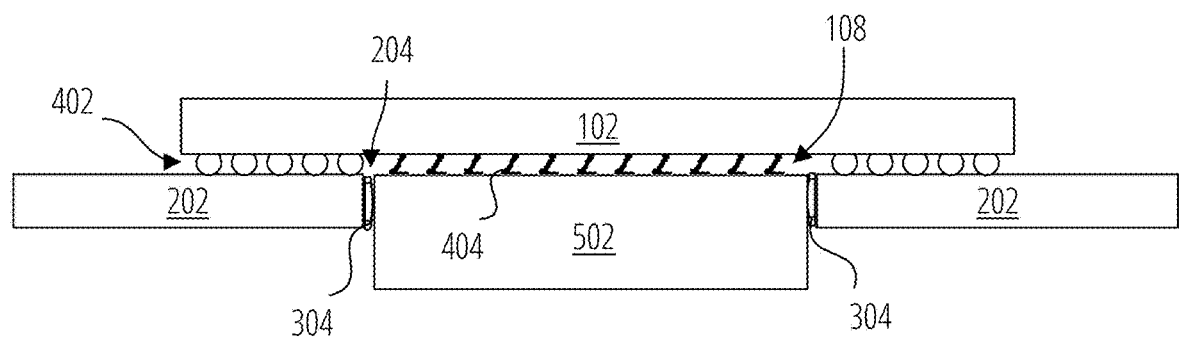
Figure 5C:
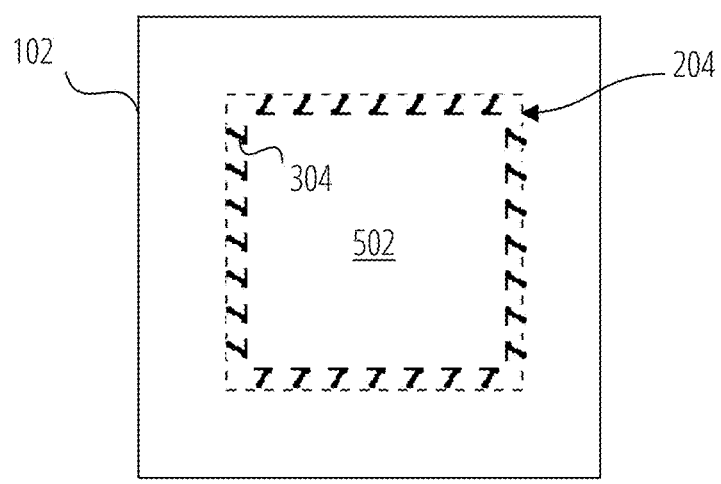

FIG. 5A through FIG. 5C also depict a circuit system in different embodiments. In these embodiments the chip package socket 302 is not utilized for mounting the power regulator 502; instead, side pins 304 for receiving power plane and control signals from the printed circuit board 202 are manufactured around the periphery of the power regulator 502 itself, and the power regulator 502 is pressure fit to electrically couple with edge pins (e.g., edge-plated flat pins) manufactured on the periphery of the cutout 204. A similar embodiment is depicted in FIG. 5B, except that spring pins 404 are utilized in the power pin region 108 instead of a ball grid array 402. These embodiments have the advantage of not incurring the use of a socket for the power regulator 502. As with other embodiments, the integrated circuit package 102 may be mounted on a top side of the printed circuit board 202, the power regulator 502 may be mounted under the integrated circuit package 102 via the cutout 204, and the power regulator 502 and the integrated circuit package 102 may share a common heat sink 406.

Figure 6A:
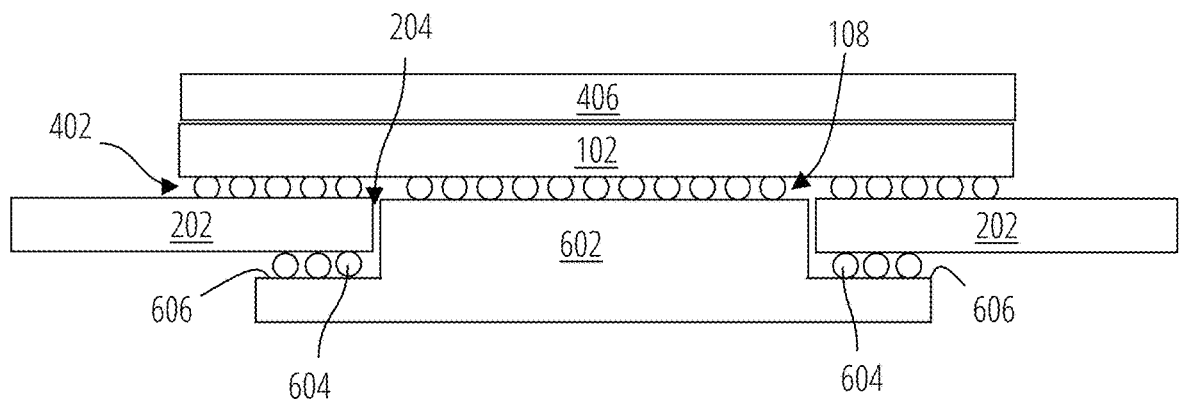
FIG. 6A through FIG. 6C also depict a circuit system in different embodiments.
Figure 6B:
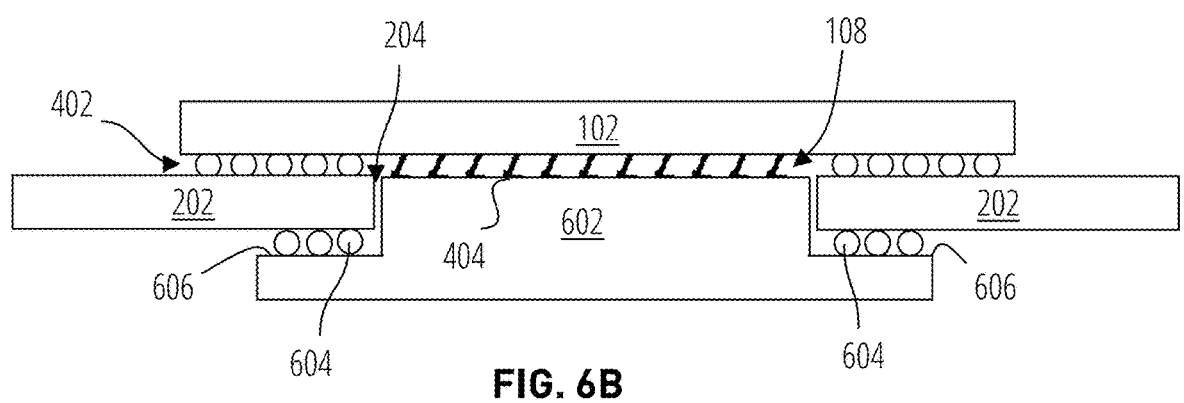
Figure 6C:
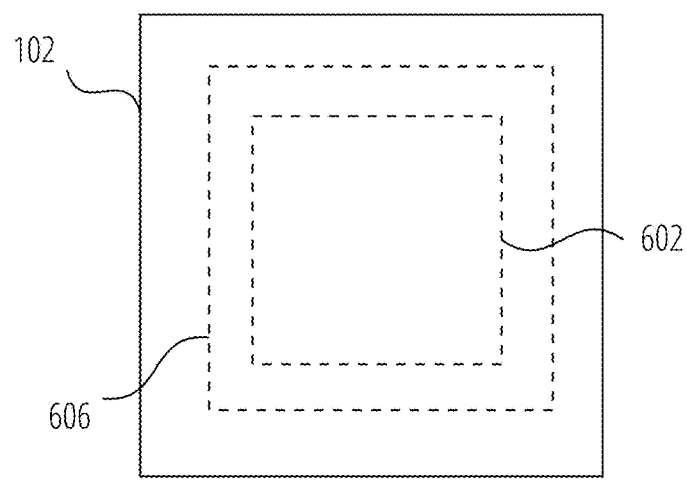

FIG. 6A through FIG. 6C also depict a circuit system in different embodiments. The power regulator 602 is formed to include a shelf 606 for a ball grid array 604 (other types of pins or pads could also be utilized) that interfaces the power regulator 602 to power and control signals in the printed circuit board 202. The power regulator 602 draws power from the printed circuit board 202 by way of connections on the shelf 606 formation, which extends beyond the area of the cutout 204.

The power regulator 602 interfaces to the integrated circuit package 102 in the power pin region 108 in any of the manners depicted in other embodiments (e.g., via a ball grid array 402, spring pins 404, pads etc.) As with other embodiments, the integrated circuit package 102 may be mounted on a top side of the printed circuit board 202, the power regulator 602 may be mounted under the integrated circuit package 102 via the cutout 204, and the power regulator 602 and the integrated circuit package 102 may share a common heat sink 406.

Figure 7:
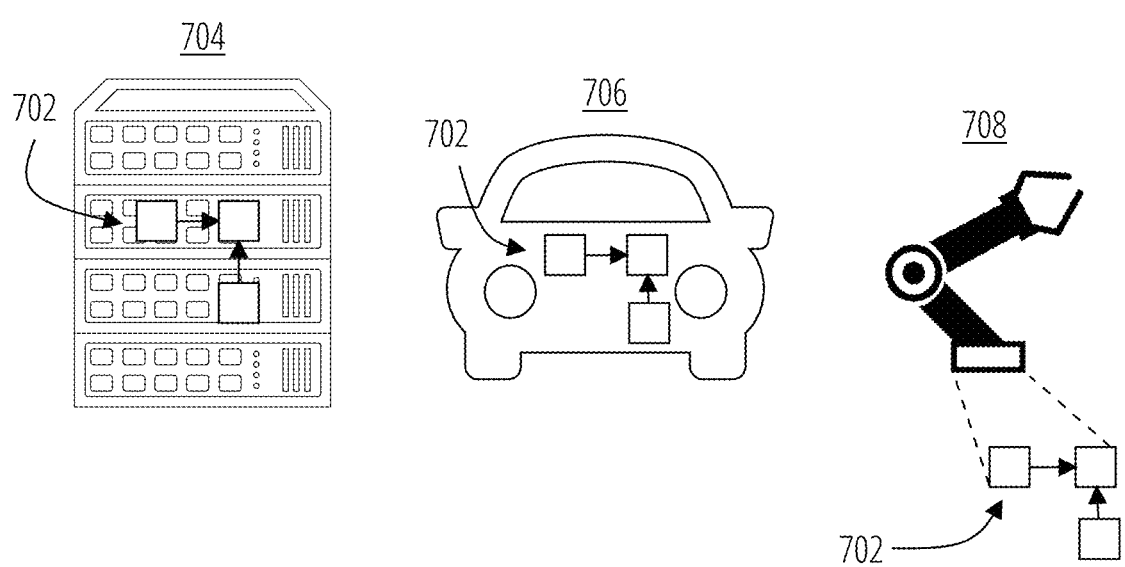
FIG. 7 depicts examples of a circuit system 702 utilized in various machines.

FIG. 7 depicts exemplary scenarios for use of a circuit system 702 in accordance with some embodiments. A circuit system 702 may be utilized in a computing system 704, a vehicle 706, and a robot 708, to name just a few examples. The circuit system 702 may comprise a graphics processing unit, central processing unit, or memory chip, coupled to a power regulator, for example.

LISTING OF DRAWING ELEMENTS 102 integrated circuit package
104 power regulator
106 printed circuit board
108 power pin region
202 printed circuit board
204 cutout
302 chip package socket
304 side pins
402 ball grid array
404 spring pin
406 heat sink
408 power regulator
502 power regulator
602 power regulator
604 ball grid array
606 shelf
702 circuit system
704 computing system
706 vehicle
708 robot Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C. § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A circuit system comprising:
   an integrated circuit package mounted on a first side of a printed circuit board;
   a power regulator disposed within a cutout region of the printed circuit board, wherein power terminals in a central region of the integrated circuit package are in direct contact with power terminals of the power regulator within a periphery of the cutout region; and
   wherein the power regulator is configured to draw power from the printed circuit board by way of side pins mounted around the cutout.

2. The circuit system of claim 1, wherein the side pins are disposed in a hollow socket around a periphery the cutout.

3. The circuit system of claim 1, wherein the side pins are disposed on an interior edge of the cutout.

4. The circuit system of claim 1, wherein the integrated circuit package is mounted on top of the printed circuit board and the power regulator is mounted under the integrated circuit package.

5. The circuit system of claim 4, further comprising a heat sink shared by the integrated circuit package and the power regulator.

6. The circuit system of claim 1, wherein the cutout is smaller than a footprint of the integrated circuit package.

7. The circuit system of claim 6, wherein the power regulator is connected to the power terminals of the central region via a ball grid array.

8. The circuit system of claim 6, wherein the power regulator is connected to the power terminals of the central region via spring pins.

9. A circuit system comprising:
   a graphics processing unit mounted on a first side of a printed circuit board;
   a power regulator disposed within a cutout region of the printed circuit board, wherein power terminals in a central region of the graphics processing unit are in direct contact with power terminals of the power regulator within a periphery of the cutout region; and the power regulator coupled to a power plane of the printed circuit board via side pins around a periphery of the cutout.

10. The circuit system of claim 9, wherein the integrated circuit package is mounted on top of the printed circuit board and the power regulator is mounted under the integrated circuit package.

11. The circuit system of claim 10, further comprising a heat sink shared by the integrated circuit package and the power regulator.

12. The circuit system of claim 9, wherein the power regulator is connected to the power terminals of the graphics processing unit via a ball grid array.

13. The circuit system of claim 9, wherein the power regulator is connected to the power terminals of the graphics processing unit via spring pins.

14. The circuit system of claim 13, wherein the spring pins are part of the power regulator.

15. The circuit system of claim 13, wherein the spring pins are part of the integrated circuit package.

16. The circuit system of claim 9, wherein the cutout is smaller than a footprint of the graphics processing unite.

17. A method of manufacturing a printed circuit board, the method comprising:
- forming a cutout in the printed circuit board, the cutout having an area less than a footprint of an integrated circuit package;
- mounting the integrated circuit package over the cutout on a first side of the printed circuit board;
- disposing a power regulator within the cutout and making direct contact between power terminals of the power regulator and power terminals in a central region of the integrated circuit package overlapping the cutout; and
- interfacing the power regulator to a power plane of the printed circuit board by way of side pins around a periphery of the cutout.

18. The method of claim 17, wherein the power regulator and the integrated circuit package are coupled via one or more of a ball grid array and spring pins.

19. The method of claim 17, wherein the integrated circuit package and the power regulator are centered on the cutout.

20. The method of claim 19, wherein the power terminals of the integrated circuit package are located in a central region bounded by the cutout.

* * * * *